Jan. 30, 1951 E. H. SCHOENFELD 2,539,639

TUNING INDICATOR FOR FREQUENCY MODULATION RECEIVERS

Filed March 31, 1948

INVENTOR
EARL H. SCHOENFELD
BY Philip G. Cooper
ATTORNEY

Patented Jan. 30, 1951 2,539,639

UNITED STATES PATENT OFFICE 2,539,639

TUNING INDICATOR FOR FREQUENCY MODULATION RECEIVERS

Earl H. Schoenfeld, Mamaroneck, N. Y., assignor to Radio Corporation of America, a corporation of Delaware Application March 31, 1948, Serial No. 18,121

12 Claims. (Cl. 250—40)

This invention relates to tuning indicator circuits and particularly to a method of and circuit for visually indicating the proper tuning of an angle-modulated carrier-wave receiver.

An amplitude-modulated carrier-wave receiver (AM receiver) is usually tuned to the desired station by adjusting its tuning control knob until the volume of the reproduced music or speech has a maximum value. However, a frequency-modulated carrier-wave receiver (FM receiver) cannot be tuned in the same manner because the volume of the reproduced sound has a maximum value not only when the receiver is correctly tuned but also when the receiver input circuit is adjusted to resonate slightly above or below the center frequency of the FM wave. When the FM receiver is tuned above or below the center frequency of the FM wave, the demodulated signal will be distorted. Various circuits have accordingly been proposed for indicating the proper tuning of an FM receiver. Usually tuning of the receiver is indicated visually by means of a so-called tuning eye which is an electronic indicator tube having a fluorescent target on which a shadow is produced which varies with the tuning indication signal.

In one proposed circuit the tuning eye is connected to the grid circuit of the limiter stage which is conventionally provided ahead of the frequency discriminator of an FM receiver. However, when the amplitude of the FM wave is comparatively high, the grid voltage of the limiter does not vary over a certain frequency range including the center frequency of the FM wave so that tuning cannot be accomplished with such a circuit. Furthermore, certain types of frequency discriminators such as a ratio detector do not require a limiter stage, and in that case this tuning indicator circuit cannot be used. A conventional ratio detector has been described in the book "FM Simplified," by Milton S. Kiver, published by D. Van Nostrand Co., Inc., New York, on page 140.

Another tuning indicator circuit has been suggested where the audio output signal derived from the frequency discriminator is utilized for obtaining a tuning indication. In this circuit, the instantaneous audio signal is integrated to derive a direct current voltage which is then impressed directly on a tuning eye. The tuning eye must be biassed so that the shadow seen on its fluorescent screen closes when the receiver is correctly tuned. When the receiver is not correctly tuned, the shadow seen on the tuning eye either opens or overlaps. However, this tuning indicator circuit has the disadvantage that the correct bias voltage for the tuning eye depends on the amplitude of the received FM wave which may vary within wide limits unless a limiter stage is provided ahead of the frequency discriminator. A circuit of this type, accordingly, cannot be used with a ratio detector which does not require the use of a limiter stage.

It is a principal object of the present invention, therefore, to provide a novel method of and circuit for visually indicating the proper tuning of an FM receiver which does not require a limiter stage for deriving the indicating signal.

A further object of the invention is to derive a signal representative of the proper tuning of an FM receiver from the balanced discriminator of the receiver.

Another object of the invention is to provide, in an FM receiver including a ratio detector, a method of and circuit for developing a signal indicative of the proper tuning of the receiver from the modulation signal derived from the ratio detector, the signal being arranged to vanish when the receiver is properly tuned.

An FM receiver may comprise a balanced frequency discriminator such, for example, as a ratio detector, having an output circuit for developing a signal representative of the modulation component of an angle-modulated carrier wave. The expression "angle-modulated carrier wave" is meant to include a frequency-modulated carrier wave (FM wave) or a phase-modulated carrier wave or a hybrid wave possessing characteristics common to both phase and frequency-modulated waves.

A tuning indicator circuit which illustrates the principles of the present invention may include, for example, an integrating circuit coupled to the output circuit of the frequency discriminator for deriving a direct current voltage which is representative of the average or mean value of the modulation signal. A chopper, which may either be a mechanical chopper or an electronic device, is coupled to the integrating circuit for periodically interrupting the direct current voltage. The direct current voltage is thus transformed into a corresponding alternating current voltage which has an amplitude that is independent from the polarity of the direct current voltage but depends only upon its absolute magnitude. This alternating current voltage is then rectified by a rectifier. Finally, an indicator such as a tuning eye is coupled to the rectifier for indicating the magnitude of the rectified voltage. When the FM receiver is properly tuned, this rectified voltage will vanish.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5, 6, 7, 8, 9, 10:
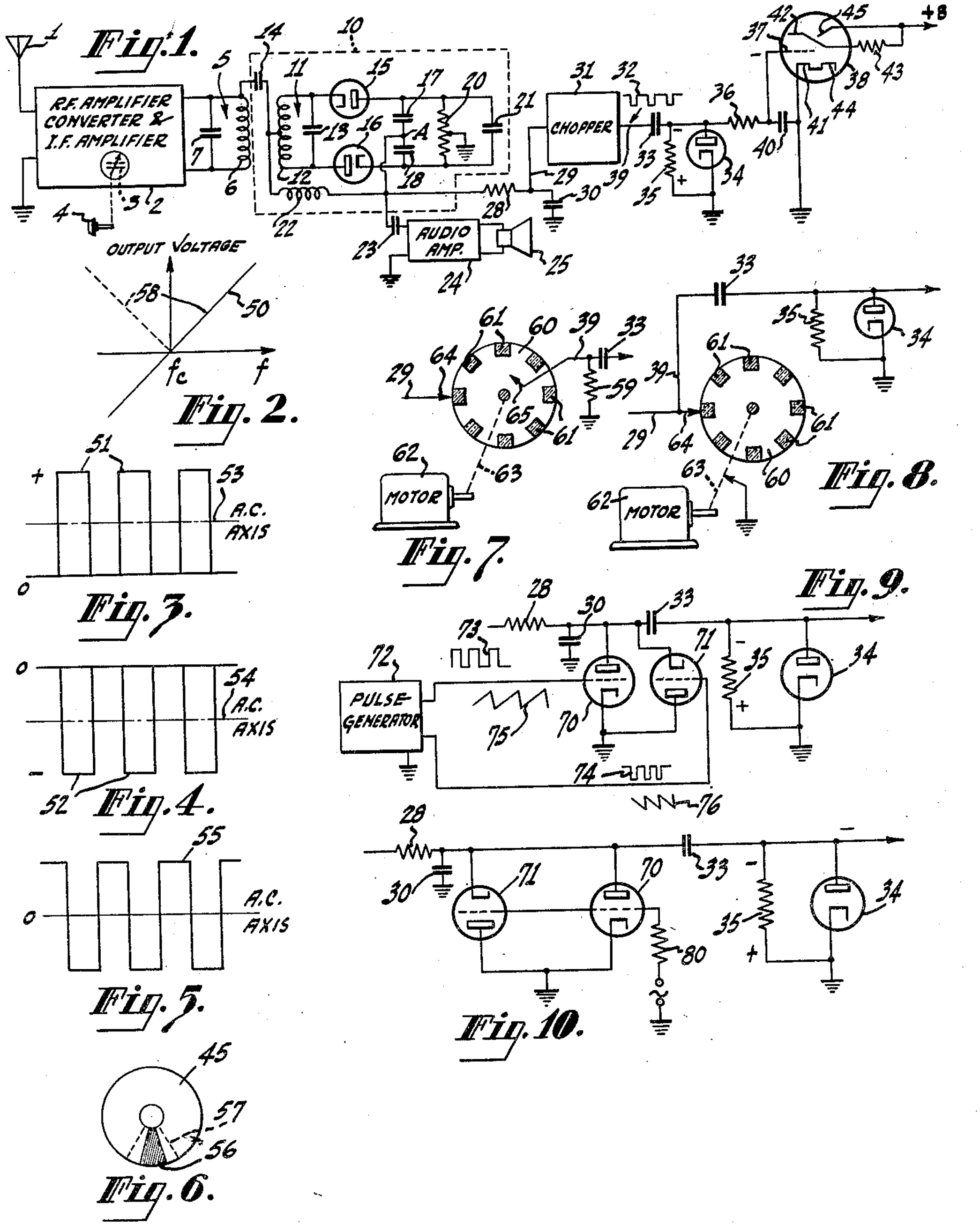
Fig. 1 is a circuit diagram, partly in block form, of an FM receiver including a ratio detector and provided with a tuning indicator circuit embodying the present invention.
Fig. 2 is a graph illustrating the instantaneous audio output voltage derived from the ratio detector of Fig. 1 in response to frequency variations of the received FM wave.
Figs. 3, 4 and 5 are graphs illustrating the interrupted voltage derived from the tuning indicator circuit of Fig. 1 when the receiver is mistuned.
Fig. 6 is a schematic front view of a tuning eye employed with the tuning indicator circuit of the invention to illustrate the shadow visible on its target.
Figs. 7 and 8 are schematic views of different mechanical choppers which may be utilized in the circuit of Fig. 1.
Fig. 9 is a circuit diagram of an electronic chopper in accordance with the invention controlled by pulses or saw-tooth waves.
Fig. 10 is a circuit diagram of an alternative electronic chopper in accordance with the invention controlled by a sinusoidal wave.

Referring now to Fig. 1 there is illustrated an FM receiver including a ratio detector and provided with a tuning indicator circuit in accordance with the present invention. An angle-modulated carrier wave may be intercepted by antenna 1 and amplified by one or more radio-frequency amplifier stages, converted to an intermediate-frequency wave and further amplified by one or more intermediate-frequency amplifier stages contained within box 2. The radio-frequency amplifier and converter stages may be tuned to a desired wave by varying a reactance such as condenser 3 shown schematically by means of tuning control knob 4. The last intermediate-frequency amplifier contained within box 2 has a tuned output circuit 5 including coil 6 resonated by condenser 7. Tuned output circuit 5 is resonant at the center frequency of the intermediate-frequency wave.

A ratio detector indicated within dotted lines 10 is coupled to tuned output circuit 5. Ratio detector 10 comprises a frequency discriminator network which includes tuned circuit 11 consisting of coil 12 resonated by condenser 13. The midpoint of coil 12 is connected to the high alternating potential terminal of coil 6 through coupling condenser 14. Furthermore, coils 6 and 12 are inductively coupled. Two diodes 15 and 16 are coupled to the frequency discriminator network. Thus, the cathode of diode 15 is connected to the upper terminal of coil 12, while the lower terminal of the coil is connected to the anode of diode 16. Load condensers 17 and 18 in series are connected to the output electrodes of diodes 15 and 16, that is, to the anode of diode 15 and to the cathode of diode 16. Resistor 20 shunts load condensers 17, 18 and is accordingly also connected to the anode of diode 15 and to the cathode of diode 16. Preferably, the midpoint of resistor 20 is grounded. Bypass condenser 21 shunts resistor 20. Condenser 21 has a low impedance for intermediate-frequency and audio-frequency currents while load condensers 17, 18 have a low impedance for intermediate-frequency currents but a high impedance for audio-frequency currents.

The junction point A of load condensers 17, 18 is connected to the midpoint of coil 12 through coil 22 forming a return path for the intermediate-frequency currents passing through the two diodes. The demodulated audio signal is derived from junction point A and impressed through coupling condenser 23 on audio amplifier 24 and reproduced by loud speaker 25.

In accordance with the present invention a tuning indicator signal is developed from the discriminator-output signal. To this end the instantaneous output signal derived from junction point A is first integrated to develop the average or direct current component of the discriminator-output signal. This is accomplished by series resistor 28 and shunt condenser 30, one terminal of which is grounded. Series resistor 28 and shunt condenser 30 represent a conventional integrating or filter circuit, and it is to be understood that any other conventional integrating circuit may be substituted for resistor 28 and condenser 30. The thus developed direct current voltage is impressed through lead 29 on chopper 31 indicated by a box. Various mechanical or electric choppers which may be substituted for box 31 will be explained hereinafter in connection with Figs. 7 to 10. Chopper 31 will periodically interrupt the direct current voltage, and the interrupted output signal 32 derived from chopper 31 shown in Fig. 1 is impressed through lead 39 and coupling condenser 33 upon diode rectifier 34 having its cathode grounded as shown. The rectified signal is developed across load resistor 35 which shunts diode 34.

The rectified signal derived from diode 34 is impressed through series resistor 36 upon control grid 37 of tuning eye indicator 38. Bypass condenser 40 is provided between control grid 37 and ground for bypassing the alternating current component of the rectified signal. Tuning eye 38 which may be of the 6E5 type has a triode section including cathode 41, control grid 37 and anode 42. Cathode 41 is grounded while anode 42 is connected to a suitable positive voltage source +B through anode resistor 43. The second section of tuning eye 38 includes cathode 44 connected to cathode 41 and fluorescent target 45 on which a shadow of anode 42 is thrown which has a variable width.

The angle-modulated carrier wave intercepted by antenna 1 is amplified and converted to an intermediate-frequency wave in a conventional manner by the components included within box 2. The amplified intermediate-frequency wave is impressed upon the frequency discriminator network. When the frequency of the wave equals the center frequency, equal voltages are impressed upon diodes 15 and 16, and an output signal of zero amplitude is derived from junction point A of load condensers 17 and 18. However, when the frequency of the wave deviates from its center frequency, the voltages impressed upon diodes 15 and 16 are no longer equal, and the voltage of junction point A becomes positive or negative depending upon whether the frequency of the wave is above or below its center frequency. This is illustrated in Fig. 2 where curve 50, which is substantially a straight line, indicates the instantaneous audio output voltage derived from point A in response to frequency variations of the input wave from the center frequency $f_c$. It will be noted that the output voltage is zero when the frequency of the wave equals its center frequency. The voltage developed across resistor 20 and bypass condenser 21 is maintained substantially constant for time variations which are short compared to one cycle of the audio signal thereby to reject undesired amplitude modulations of the FM wave.

However, the mean or direct current component of the audio output voltage derived from point A is only zero when the radio-frequency amplifier and converter stages are properly tuned by tuning control knob 4 to the center frequency of the received wave. Let it be assumed that the receiver is tuned to a frequency above the center frequency of the received wave. In that case, the audio output signal derived from junction point A may have an average or direct current component that is positive. This average or direct current voltage component is derived from integrating circuit 28, 30 and impressed upon chopper 31 where it is periodically interrupted. The output wave derived from chopper 31 under these conditions is illustrated in Fig. 3 and consists of pulses 51 which are positive with respect to ground. On the other hand, if the receiver is mistuned to a frequency below the center frequency $f_c$, the instantaneous audio signal derived from point A will include a negative direct current voltage component which is filtered by integrating circuit 28, 30 and interrupted by chopper 31. The resulting pulses 52 are illustrated in Fig. 4 and have a negative polarity with respect to ground.

Pulses 51 and 52 are now impressed upon diode rectifier 34 through coupling condenser 33 and, accordingly, pulses 51 and 52 are centered on the alternating current axis 53 or 54 respectively. The position of axis 53 or 54 only depends on the duration of each pulse 51 or 52 compared to the time between consecutive pulses. The resulting pulses which are derived from coupling condenser 33 and impressed upon diode rectifier 34 are illustrated at 55 in Fig. 5. Pulses 55 have an amplitude which is independent of the polarity of the direct current voltage and which depends only upon the absolute magnitude of the direct current voltage. When pulses 55 are impressed upon diode rectifier 34, a negative voltage is developed across resistor 35 which is impressed through resistor 36 on control grid 37 of tuning eye 38. Consequently, as illustrated in Fig. 6 fluorescent target 45 of tuning eye 38 has a narrow shadow 56 as long as the receiver is not properly tuned.

As tuning control knob 4 is adjusted to tune the receiver to the correct frequency the amplitude of pulses 55 decreases and consequently a voltage which is less negative is impressed upon control grid 37 of tuning eye 38. The tuning eye accordingly "opens" and the shadow increases in size or width as indicated in Fig. 6 in dotted lines 57.

The FM receiver of Fig. 1 is therefore tuned by adjusting tuning control knob 4 until the shadow 57 seen on the target 45 of tuning eye 38 has its maximum width. It will be seen that the direct current voltage derived from point A which is interrupted and fed through coupling condenser 33 causes the same tuning indication to appear on tuning eye 38 whether the receiver is mistuned to the same extent above or below resonance. Thus, the signal impressed upon control grid 37 of the tuning eye varies with the frequency to which the receiver is tuned in the manner indicated by lines 58 of Fig. 2. This signal decreases to zero when the receiver is properly tuned. Unless the direct current voltage derived from point A is interrupted in the manner described, tuning eye 38 will not indicate the proper tuning of the receiver because the indicating signal would simply change its polarity when the receiver is tuned through the current frequency, and the tuning eye is not responsive to a signal of such character.

Referring now to Fig. 7 there is illustrated a mechanical chopper which may be substituted for box 31 in Fig. 1. The chopper of Fig. 7 comprises a flat metallic disc 60 having inserts 61 of insulating material. Disc 60 is rotated by a suitable motor 62 through the intermediary of a drive shaft schematically indicated at 63. The average or direct current voltage is impressed through lead 29 on brush 64 riding on the circumference of disc 60. Brush 65 slides over the metallic portion of disc 60 and is connected to output lead 39 which, in turn, is connected to coupling condenser 33. Lead 39 is grounded through resistor 59 to provide a discharge path for condenser 33. When disc 60 rotates, the voltage impressed upon coupling condenser 33 is periodically interrupted and condenser 33 is periodically discharged.

Referring now to Fig. 8 there is illustrated an alternative form of a mechanical chopper by means of which the signal impressed upon coupling condenser 33 may be periodically grounded. Input lead 29 is connected to brush 64 riding over the circumference of the metallic disc 60. Whenever brush 64 touches the metallic portion of disc 60, the signal is grounded through drive shaft 63. On the other hand when brush 64 makes contact with an insulating insert 61, the signal is impressed upon coupling condenser 33 through lead 39.

Referring now to Fig. 9 there is illustrated an electronic chopper which may be substituted for box 31 of Fig. 1. Triode 70 has its anode connected to the junction point between series resistor 28 and coupling condenser 33. The cathode of triode 70 is grounded. Triode 71 has its cathode connected to the junction point between series resistor 28 and coupling condenser 33 while its anode is grounded. The control grid of triode 70 is connected to pulse generator 72 which may develop pulses 73 of positive polarity. Output pulses 74 of negative polarity are also developed by pulse generator 72 and impressed on the control grid of triode 71.

It will now readily be seen that when the receiver of Fig. 1 is tuned above the center frequency of the FM wave a positive voltage is developed and impressed upon the anode of triode 70 and the cathode of triode 71. Triode 70 will accordingly conduct whenever its control grid is rendered sufficiently positive with respect to its cathode by a pulse 73. Triode 71 will not conduct space current. On the other hand, when the receiver is mistuned to a frequency below the center frequency of the desired wave, a negative voltage is impressed upon the anode of triode 70 and the cathode of triode 71. In this case, triode 70 will not conduct. Triode 71 will normally conduct space current but will be periodically rendered nonconducting whenever its control grid is driven sufficiently negative by a pulse 74.

The circuit of Fig. 9 may be used with advantage in the audio channel of a television receiver. In that case, pulses 73 and 74 may be derived from the synchronizing pulses of the composite video signal. Alternatively, a positive saw-tooth wave 75 may be impressed on the control grid of triode 70 and a negative saw-tooth wave may be impressed on the control grid of triode 71. Alternatively, the same symmetrical saw-tooth wave may be simultaneously impressed on the control grids of both triodes 70 and 71. Saw-tooth waves 75 and 76 may be derived from the deflection generators of a television receiver.

Instead of impressing a pulse 73 of positive polarity on the control grid of triode 70 and a pulse 74 of negative polarity on the control grid of triode 71, it is feasible to impress the same pulse having a positive and a negative portion above and below zero voltage on both control grids of triodes 70 and 71. In any case, the signal impressed upon coupling condenser 33 is periodically grounded or interrupted at a rate corresponding to the repetition rate of pulses 73, 74 or of saw-tooth waves 75, 76.

Referring now to Fig. 10 there is illustrated an alternative electronic chopper which may be substituted for box 31 in Fig. 1. The electronic chopper comprises triodes 70 and 71. Triode 70 has its anode connected to the junction point between series resistor 28 and coupling condenser 23, while triode 71 has its cathode connected to the same junction point, the cathode of triode 70 and the anode of triode 71 being grounded. A sinusoidal wave is impressed through grid resistor 80 upon the control grids of triodes 70 and 71. Grid resistor 80 preferably has a large resistance value. The electronic chopper of Fig. 10 operates in the same manner as that of Fig. 9 except that triodes 70 and 71 are rendered conductive by a sinusoidal wave.

If the receiver is tuned to a frequency above the center frequency of the FM wave, a positive direct current voltage is impressed upon the anode of triode 70 and the cathode of triode 71. Triode 70 will be rendered conductive whenever the wave impressed upon its control grid exceeds the cut-off voltage. During that period of time coupling condenser 33 is discharged to ground potential. During the remainder of the cycle of the sinusoidal wave triode 70 remains nonconducting. Triode 71 does not conduct current under these conditions. On the other hand, when the receiver is tuned to a frequency below the center frequency of the FM wave to be received, a negative voltage is impressed upon the anode of triode 70 and the cathode of triode 71. Triode 70 will not conduct space current under these conditions. Triode 71, on the other hand, will be rendered conducting whenever its control grid is driven beyond the cut-off voltage with respect to the cathode, that is, during the positive portion of the sine wave. During that period of time, coupling condenser 33 is discharged and brought to ground potential.

There has thus been described a circuit for developing a signal indicative of the proper tuning of an FM receiver. At first, the average or direct current component of the instantaneous audio signal developed by a ratio detector is derived. The direct current voltage is periodically interrupted or brought to ground potential, passed through a coupling condenser and is impressed on a rectifier where the interrupted signal is rectified. The rectified output signal vanishes when the receiver is properly tuned which may be determined by an electronic indicator such as a tuning eye. The tuning circuit of the present invention actually measures the average or mean voltage between the junction point A of load condensers 17, 18 and the grounded midpoint of resistor 20. If the midpoint of resistor 20 is not grounded, chopper 31 and rectifier 34 should be returned to the midpoint of resistor 20.

The tuning indicator circuit of the present invention has been shown connected to a ratio detector. It is to be understood, however, that the tuning indicator circuit of the present invention may be used in connection with any balanced frequency discriminator provided its instantaneous audio output voltage varies with variations of the frequency in the manner illustrated by curve 50 of Fig. 2. All that is necessary is to feed the audio output signal into filter circuit 28, 30 of the tuning indicator circuit of the present invention.

What is claimed is:

1. A tuning indicator circuit for a balanced frequency discriminator comprising an output circuit coupled to said discriminator for developing a signal representative of the modulation component of an angle-modulated carrier wave, an integrating circuit coupled to said output circuit for deriving a direct current voltage representative of the average value of said signal, a chopper coupled to said integrating circuit for periodically interrupting said direct current voltage, a rectifier coupled to said chopper for rectifying said interrupted direct current voltage, and an indicator coupled to said rectifier for indicating the magnitude of said rectified voltage.

2. A tuning indicator circuit for a balanced frequency discriminator comprising an output circuit coupled to said discriminator for developing a modulation signal representative of the modulation component of an angle-modulated carrier wave, a filter circuit coupled to said output circuit for deriving a direct current voltage representative of the average value of said signal, a chopper coupled to said filter circuit for periodically interrupting said direct current voltage, a rectifier coupled to said chopper for rectifying said interrupted direct current voltage, a condenser coupled between said chopper and said rectifier and a tuning eye indicator coupled to said rectifier for visually indicating the magnitude of said rectified voltage.

3. In a frequency-modulated carrier wave receiver, a balanced frequency discriminator for deriving a modulation signal from said wave, said discriminator comprising a frequency discriminator network for deriving from said wave a pair of voltages whose relative magnitudes are dependent upon the frequency modulation of said wave, two rectifiers, said rectifiers being coupled to said network to apply each of said voltages to one of said rectifiers, a rectifier output circuit coupled to said rectifiers for deriving a modulation signal having an average value which is zero when said receiver is properly tuned to said wave; a tuning indicator circuit comprising an integrating circuit coupled to said rectifier output circuit for deriving a direct current voltage representative of the average value of said modulation signal, a chopper coupled to said integrating circuit for periodically interrupting said direct current voltage, a further rectifier coupled to said chopper for rectifying said interrupted direct current voltage, and an indicator coupled to said further rectifier for indicating the magnitude of said rectified voltage.

4. In a frequency-modulated carrier-wave receiver, a balanced frequency discriminator for deriving a modulation signal from said wave, said discriminator comprising a frequency discriminator network for deriving from said wave a pair of voltages whose relative magnitudes are dependent upon the frequency modulation of said wave, two rectifiers, said rectifiers being coupled to said network to apply each of said voltages to one of said rectifiers, a rectifier output circuit coupled to said rectifiers for deriving a modulation signal having an average value which is zero when said receiver is properly tuned to said wave; a tuning indicator circuit comprising a filter circuit coupled to said rectifier output circuit for deriving a direct current voltage representative of the average value of said modulation signal, a chopper coupled to said filter circuit for periodically interrupting said direct current voltage, a further rectifier coupled to said chopper for rectifying said interrupted direct current voltage, a condenser connected in series between said chopper and said further rectifier, and a tuning eye indicator coupled to said further rectifier for indicating the magnitude of said rectified voltage.

5. In a frequency-modulated carrier wave receiver, a balanced frequency discriminator for deriving a modulation signal from said wave, said discriminator comprising a frequency discriminator network for deriving from said wave a pair of voltages whose relative magnitudes are dependent upon the frequency modulation of said wave, two rectifiers, said rectifiers being coupled to said network to apply each of said voltages to one of said rectifiers, a rectifier output circuit coupled to said rectifiers for deriving a modulation signal having an average value which is zero when said receiver is correctly tuned to said wave; a tuning indicator circuit comprising an integrating circuit coupled to said rectifier output circuit for deriving a direct current voltage representative of the average value of said modulation signal, two space discharge tubes connected between said integrating circuit and a point of fixed potential, a source of control waves coupled to said tubes for periodically rendering one of said tubes conducting to bring said direct current voltage, to said fixed potential, a further rectifier coupled to said chopper for rectifying the interrupted direct current voltage, and an indicator coupled to said further rectifier for indicating the magnitude of said rectified voltage.

6. In a frequency-modulated carrier wave receiver, a balanced frequency discriminator for deriving a modulation signal from said wave, said discriminator comprising a frequency discriminator network for deriving from said wave a pair of voltages whose relative magnitudes are dependent upon the frequency modulation of said wave, two rectifiers, said rectifiers being coupled to said network to apply each of said voltages to one of said rectifiers, a rectifier output circuit coupled to said rectifiers for deriving a modulation signal having an average value which is zero when said receiver is properly tuned to said wave; a tuning indicator circuit comprising an integrating circuit coupled to said rectifier output circuit for deriving a direct current voltage representative of the average value of said modulation signal, two space discharge tubes connected between said integrating circuit and a point of fixed potential, a source of control waves coupled to said tubes, said tubes being connected in such a manner that one of said tubes is rendered periodically conducting depending on the polarity of said direct current voltage to bring said direct current voltage to said potential, a further rectifier coupled to said chopper for rectifying said interrupted direct current voltage, a condenser connected in series between said chopper and said further rectifier, and an electronic indicator coupled to said further rectifier for indicating the magnitude of said rectified voltage.

7. In an angle-modulated carrier-wave receiver, a ratio detector comprising a frequency discriminator network, two rectifiers coupled to said network, a rectifier output circuit coupled to said rectifiers and including a pair of load condensers connected in series to the output electrodes of said rectifiers, a resistor connected to said rectifier output electrodes and in parallel with said condensers to form a direct current path with said rectifiers, a modulation signal output circuit connected to the junction point of said load condensers; a tuning indicator circuit for indicating the average voltage between said junction point and the midpoint of said resistor, said average voltage being zero when said receiver is properly tuned to the wave to be received, said tuning indicator circuit comprising an integrating circuit coupled to said junction point for deriving a direct current voltage representative of the average value of said signal, a chopper coupled to said integrating circuit for periodically interrupting said direct current voltage, a further rectifier coupled to said chopper for rectifying the interrupted direct current voltage, a condenser connected in series between said chopper and said further rectifier, and an indicator coupled to said further rectifier for indicating the magnitude of said rectified voltage.

8. In an angle-modulated carrier-wave receiver, a ratio detector comprising a frequency discriminator network, two rectifiers coupled to said network, a rectifier output circuit coupled to said rectifiers and including a pair of load condensers connected in series to the output electrodes of said rectifiers, a resistor connected to said rectifier output electrodes and in parallel with said condensers to form a direct current path with said rectifiers, a modulation signal output circuit connected to the junction point of said load condensers; a tuning indicator circuit for indicating the average voltage between said junction point and the midpoint of said resistor, said average voltage being zero when said receiver is properly tuned to the wave to be received, said tuning indicator circuit comprising an integrating circuit coupled to said junction point for deriving a direct current vo'tage representative of the average value of said signal, a chopper connected between said integrating circuit and said midpoint for periodically bringing said direct current voltage to the potential of said midpoint, a further rectifier coupled to said chopper for rectifying the interrupted direct current voltage, and an indicator coupled to said further rectifier for indicating the magnitude of said rectified voltage.

9. In an angle-modulated carrier-wave receiver, a ratio detector comprising a frequency discriminator network, two rectifiers coupled to said network, a rectifier output circuit coupled to said rectifiers and including a pair of load condensers connected in series to the output electrodes of said rectifiers, a resistor connected to said rectifier output electrodes and in parallel with said condensers to form a direct current path with said rectifiers, a modulation signal output circuit connected to the junction point of said load condensers; a tuning indicator circuit for indicating the average voltage between said junction point and the midpoint of said resistor, said average voltage being zero when said receiver is properly tuned to the wave to be received, said tuning indicator circuit comprising an integrating circuit connected between said junction point and said midpoint for deriving a direct current voltage representative of the average value of said signal, a chopper connected between said integrating circuit and said midpoint for periodically bringing said direct current voltage to the potential of said midpoint, a further rectifier coupled to said chopper for rectifying the interrupted direct current voltage, a condenser connected in series between said chopper and said further rectifier, and a tuning eye indicator coupled to said further rectifier for indicating the magnitude of said rectified voltage.

10. The method of indicating tuning of an angle-modulated carrier-wave receiver which comprises demodulating said wave to derive a modulation signal, filtering said modulation signal to derive a mean direct current voltage, transforming said mean voltage into a corresponding alternating current voltage, rectifying said alternating current voltage, and utilizing said rectified voltage for tuning indication.

11. The method of indicating tuning of an angle-modulated carrier-wave receiver which comprises demodulating said wave to derive a modulation signal, integrating said modulation signal to derive an average direct current voltage, periodically interrupting said average voltage to develop a corresponding alternating current voltage, rectifying said alternating current voltage, and utilizing said rectified voltage for tuning indication.

12. The method of indicating tuning of an angle-modulated carrier-wave receiver which comprises demodulating said wave to derive a modulation signal, filtering said modulation signal to derive a mean direct current voltage, developing an alternating current voltage representative of the amplitude of said mean voltage regardless of its polarity, rectifying said alternating current voltage, and obtaining a tuning indication in accordance with the magnitude of said rectified voltage.

EARL H. SCHOENFELD.

REFERENCES CITED

The following references are of record in the file of this patent:

UNITED STATES PATENTS

| Number | Name | Date |
|---|---|---|
| 2,175,690 | Happe | Oct. 10, 1939 |
| 2,280,607 | Roberts | Apr. 21, 1942 |
| 2,286,413 | Herold et al. | June 16, 1942 |